United States Patent [19]

Ohya et al.

[11] Patent Number: 5,798,544

[45] Date of Patent: Aug. 25, 1998

[54] SEMICONDUCTOR MEMORY DEVICE HAVING TRENCH ISOLATION REGIONS AND BIT LINES FORMED THEREOVER

[75] Inventors: Shuichi Ohya; Masato Sakao; Yoshihiro Takaishi; Kiyonori Kajiyana; Takeshi Akimoto; Shizuo Oguro; Seiichi Shishiguchi, all of Tokyo, Japan

[73] Assignee: NEC Corporation, Tokyo, Japan

[21] Appl. No.: 242,345

[22] Filed: May 13, 1994

[30] Foreign Application Priority Data

Apr. 22, 1994 [JP] Japan .................. 6-084760

[51] Int. Cl.$^6$ .......................... H01L 27/108; H01L 29/76
[52] U.S. Cl. .................. 257/296; 257/68; 257/71; 257/303; 257/306
[58] Field of Search .................. 257/66, 67, 68, 257/71, 303, 306, 504, 513, 630, 296

[56] References Cited

U.S. PATENT DOCUMENTS

| | | | |
|---|---|---|---|
| 4,926,378 | 5/1990 | Uchida et al. | 365/179 |
| 5,029,127 | 7/1991 | Uchida et al. | 365/63 |
| 5,170,243 | 12/1992 | Dhong et al. | 365/208 |
| 5,463,236 | 10/1995 | Sakao | 257/306 |

*Primary Examiner*—Valencia Wallace
*Attorney, Agent, or Firm*—Whitham, Curtis & Whitham

[57] ABSTRACT

Disclosed herein is a semiconductor memory device including a plurality of memory cells each includes an active region which is defined in a column direction by a pair of trench isolation regions formed in a semiconductor substrate and in a row direction by an isolation gate conductor lines formed on a first gate insulating film covering the substrate, a source and a drain region selectively formed in the active region to define a channel region of a cell transistor, a second gate insulating film formed on the channel region, a word line formed on the second gate insulating film, a first insulating film covering the active region and the word line, a bit line formed on the first insulating film to overlap with the isolation gate conductor, a bit line connection conductor formed in the first insulating film to connect the drain region to the bit line with being in contact with the sidewall surface of the bit line, a second insulating film covering the bit line and the first insulating film, and a storage capacitor having a capacitor electrode connected to the source region through a contact hole provided in the first and second insulating film.

8 Claims, 11 Drawing Sheets

5,798,544

1

SEMICONDUCTOR MEMORY DEVICE HAVING TRENCH ISOLATION REGIONS AND BIT LINES FORMED THEREOVER

BACKGROUND OF THE INVENTION

The present invention relates to a semiconductor memory device and, more particularly, to a dynamic random access memory device (DRAM) having memory cells each composed of one transistor and one storage capacitor.

In order to increase the memory capacity of a DRAM, it is necessary to shrink the cell size of each memory cell while maintaining a required storage capacitance. To this end, a memory cell array shown in FIG. 22 and 23 is disclosed in a Copending U.S. Patent Application assigned to the same assignee as the present application. Incidentally, FIG. 23 is a cross sectional view along a line A–A' shown in FIG. 22.

In FIGS. 22 and 23, a plurality of memory cell active regions 104 are arranged in a matrix form of rows and columns in a P-type silicon substrate 101. Each of the cell active regions 104 are surrounded and thus isolated from one another by a trench 102 filled with a silicon oxide film 103. There are further provide a plurality of trenches 117 each running in a row direction, and word lines 105 are buried in the respective trenches 117 with intervention of a gate oxide film 106. Source and drain regions 107 and 108 are formed in the respective surface portions of each cell active region 104. The substrate 101 thus constituted is covered with a silicon oxide film 109 having bit line contact holes 105, and bit lines 115 are formed on the oxide film 109 in a column direction. Each of the bit lines 116 is connected to the associated ones of the drain regions 108 through the bit line contact holes 115. A silicon oxide film 114 is further formed on the entire surface, and a plurality of capacitor contact holes 110 are formed in the oxide films 109 and 114 to expose the respective parts of the source regions 107. For the storage capacitor, storage electrodes 111 each connected to the corresponding source region 107 through the contact hole 110, a dielectric film 112 and a cell plate electrode 113 are formed as shown in the drawings.

According to this cell structure, each word line 105 is buried in the trench 117 and therefore the steps of the device surface are suppressed. Moreover, the channel region of each cell transistor is expanded in the depth direction of the substrate 101, so that the so-called short channel effect is suppressed. Since each storage capacitor is formed over the word and bit lines 105 and 116, the area of the storage electrode 111 is enlarged to provide a large capacitance value.

However, since each cell active region 104 surrounded by the trench isolation region 117, is cannot formed in a rectangular pattern, but is formed in a polygon pattern like a parallelogram as shown in the drawings. For this reason, each corner of the pattern is made rounded to transform or shrink the pattern of each cell active region 104. Moreover, voids are easy to be formed at the cross portions of the insulating film 103.

Another memory cell array for the purpose as described above is shown in FIGS. 24–26. This memory cell structure is disclosed in another co-pending U.S. Patent Application assigned to the same assignee as the present application. In FIGS 24–26, a P-type silicon substrate 201 is prepared, and a plurality of trenches 202 are formed in the substrate 210 in parallel to one another in a column or bit line direction. A plurality of cell active regions 204 are thereby defined in a row or word line direction. Each of the trenches 202 is filled with a silicon oxide film 203. A plurality of word lines 205

2 and a plurality of isolation gate conductor lines 218 are formed on the substrate with the intervention of a gate oxide film 206. Each of the isolation gate conductor lines 218 is formed ever two word lines to thereby isolate each cell active region 204 in the bit line direction. Source and drain regions 207 and 208 are formed in the corresponding portions of each cell active region 204 in a self-alignment manner with the lines 205 and 218. An insulating film 209 is formed on the entire surface, and a plurality of capacitor contact holes 210 are selectively formed to expose the respective parts of the source regions 207. A plurality of storage electrode 211, a dielectric film 212 and a cell plate electrode 213 are formed to constitute a plurality of storage capacitors each connected to the corresponding source region 207 of the cell transistor. A silicon oxide film 214 is further formed to cover the entire surface, and a plurality of bit line contact holes 215 are formed in the insulating films 209 and 214 to expose the respective parts of the drain regions 208. Bit lines 216 are formed on the film 214 in contact with the drain regions 208 through the holes 215.

In this memory cell array, the trench isolation structure is employed only in the bit line direction. In the word line direction, the gate conductor line 218 is employed which is formed simultaneously with the word lines 205. Accordingly, the each cell active region 204 is formed in a rectangular pattern and the transformation thereof is suppressed. Moreover, the insulating films 203 filling the trenches 202 are formed only in the bit line direction and thus free from the generation of the voids.

However, each storage capacitor is formed under the bit line 216 and therefore, the enlargement of the storage capacitance is suppressed.

SUMMARY OF THE INVENTION

It is therefore an object of the present invention to provide a semiconductor memory device having an improved memory cell structure.

It is another object of the present invention to provide a semiconductor memory device including memory cells each formed in a cell active region having a rectangular pattern to provide an enlarged storage capacitance.

A semiconductor memory device according to the present invention is characterized in that each of the memory cells composed of a cell transistor and a storage capacitor includes a cell active region defined in a first direction by a pair of trench isolation regions selectively formed in a semiconductor substrate in parallel to each other and in a second direction perpendicular to the first direction by a pair of isolation gate conductor lines formed on a first insulating film covering the substrate, first and second regions for the cell transistor selectively formed in the cell active region to define a channel region of the cell transistor, a word line formed on a gate insulating film covering the channel region, the first insulating film having the same thickness as the gate insulating film, a second insulating film covering the cell active region, the isolation gate conductor line and the word line, a bit line formed to overlap with the trench isolation region with the intervention of the second insulating film, a bit line contact hole selectively formed in the second insulating film to expose a part of the first region, a conductive film filling the bit line contact hole to be in contact with the part of the first region and elongated to be in contact with the side surface of the bit line, a third insulating film covering the second insulating film, the bit line and the conductive film, a capacitor contact hole selectively formed in the second and third insulating films to expose a part of the second region, a storage electrode formed on the third insulating film and filling the capacitor contact hole to be in contact with the part of the second region, a dielectric film formed on the storage electrode, and a cell plate electrode formed on the dielectric film.

Thus, the bit line is formed to overlap with the trench isolation region and the connection between the first region and the bit line is carried out by the conductive film. Therefore, the cell active region is formed in a rectangular pattern. Moreover, the storage electrode is formed over the bit and word lines and thus is enlarged in an area thereof to enlarge the storage capacitance.

BRIEF DESCRIPTION OF THE DRAWINGS

The above and other objects, features and advantages of the present invention will be more apparent from the following description taken in conjunction with the accompanying drawings, wherein.

DETAILED DESCRIPTION OF THE PREFERRED EMBODIMENTS

Figure 1:
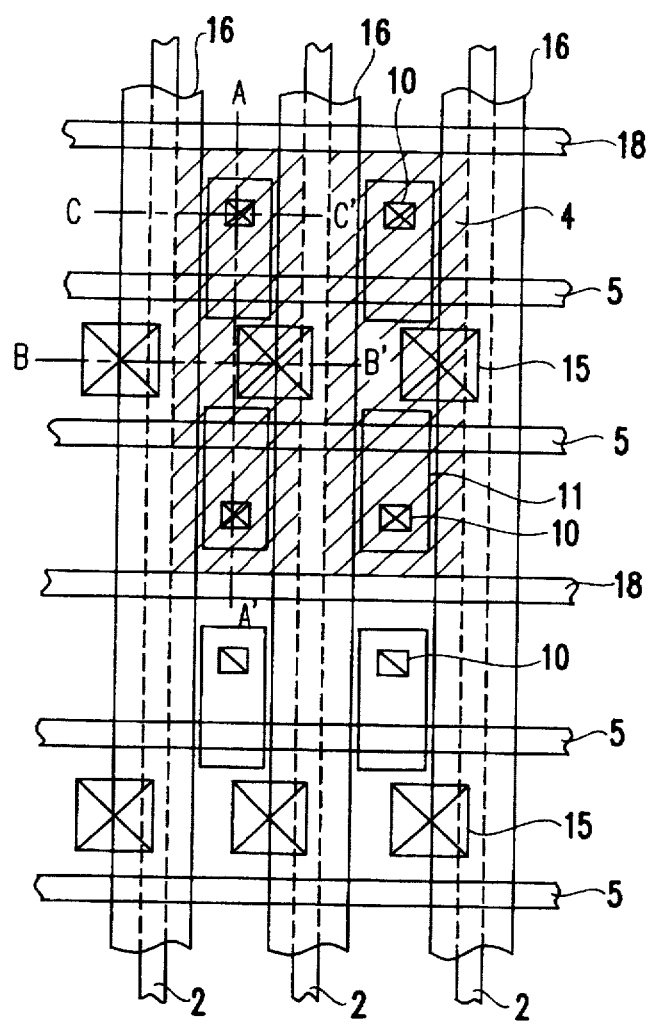
FIG. 1 is a plan view illustrative of a part of a memory cell array according to a first embodiment of the present invention.
Figure 2:
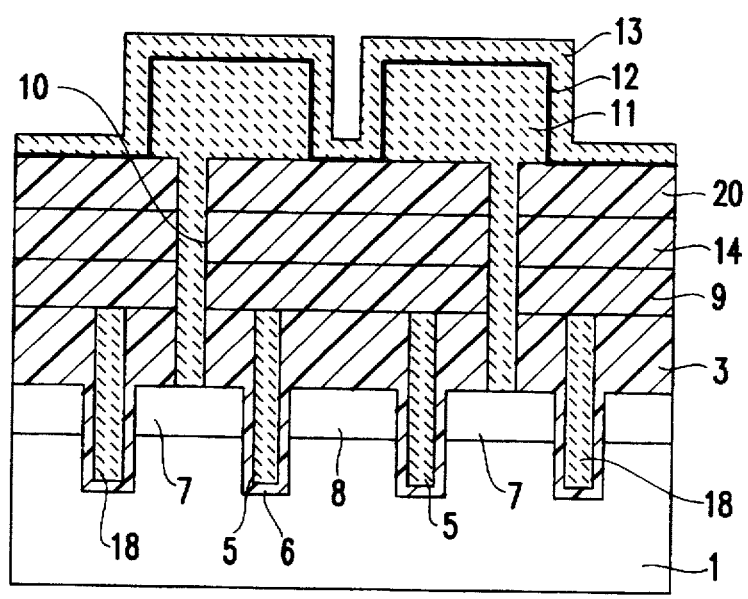
FIG. 2 is a cross sectional view along a line A–A' shown in FIG. 1.
Figure 3:
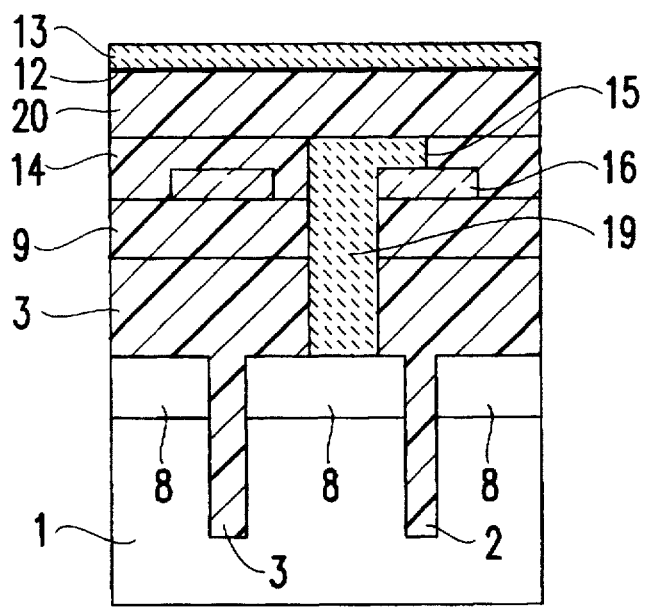
FIG. 3 is a cross sectional view along a line B–B' shown in FIG. 1.
Figure 4:
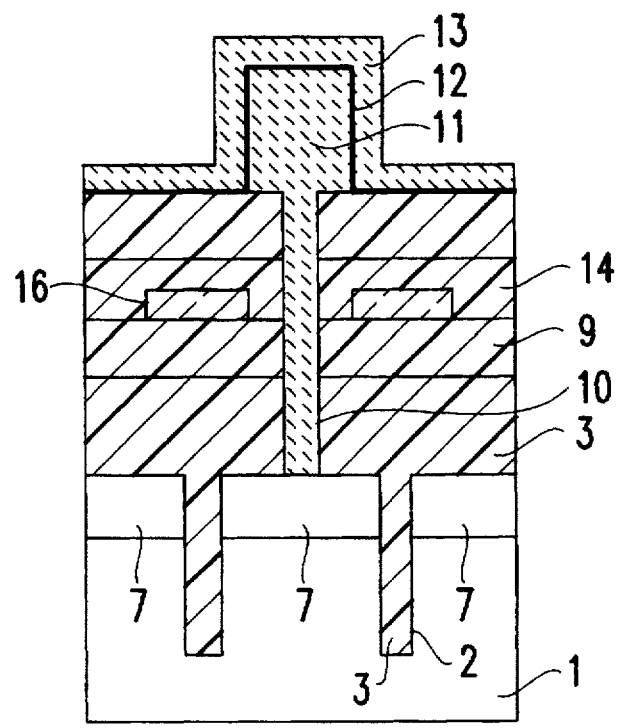
FIG. 4 is a cross sectional view along a line C–C' shown in FIG. 1.

Referring now to FIGS. 1 to 4, a semiconductor memory device according to a first embodiment of the present invention includes a P-type silicon substrate 1, and a plurality of trenches 2 are formed in the surface portion thereof in parallel to one another in a column or bit line direction in width of 0.1 μm, in depth of 0.6 μm and in pitch of 0.6 μm. Each of the trenches 2 is filled with a silicon oxide film 3. There are further provided a plurality of trenches 17 in parallel to one another in a row or word line direction in width of 0.1 μm, in depth of 0.4 μm and in pitch of 0.6 μm. A plurality of word lines 5 and isolation gate conductor lines 18 each made of polysilicon are buried in the respective trenches 17 with the intervention of a gate oxide film 6. The gate conductor lines 18 are formed every two word lines 5, as shown in Figures. Each of the word lines 5 has portions serving as respective gates of the cell transistors connected to the corresponding word line. Each of the isolation gate conductor lines 18 are supplied with a bias voltage to cut off the stray channel formed along the trench 17 to thereby isolate the adjacent cell active regions 4. In this embodiment, since the substrate is of a P-type, the ground voltage is supplied to each conductor line 18. In the case of employing an N-type substrate, the positive power voltage is applied to each conductor line 18. The active regions 4 are thereby isolated from one another by the trench isolation regions 2 in the word line or row direction and by the gate conductor lines 18 in the bit line or column direction.

Source and drain regions 7 and 8 of an N-type are formed in each of the cell active regions 4 in 0.2 μm depth. Formed entirely on the substrate 1 thus constituted is a silicon oxide film 9. A plurality of bit lines 16 made of tungsten-silicide are formed on the oxide film 9 to overlap with the corresponding trench isolation regions 2 in parallel to one another. The oxide film 9 and each bit line 16 are covered with a silicon oxide film 14. The electrical connection between each bit line 16 and the corresponding drain region 8 is carried out by a polysilicon conductor 19 buried in a bit line contact hole 15 provided in the oxide films 3, 9 and 14. This conductor 19 is formed in contact with the part of the drain region 8 and the side surface of the bit line 16. An insulating film 20 such a silicon oxide film are formed over the entire surface to cover the oxide film 14 and the conductor 19. Formed on the insulating film 20 is a plurality of storage electrode 11 each made of polysilicon and connected to the corresponding source region 7 through a capacitor contact hole 10 formed to penetrate the films 3, 9, 14 and 20. A dielectric film 12 such as a silicon nitride film is formed on each storage electrode 11 and the insulating film 20, and a cell plate electrode 13 is formed on the dielectric film 12. The storage capacitor of the memory cell is thus constituted.

Since each of the active regions 4 is defined in the row direction by a pair of trench isolation regions 2 and in a column direction by a pair of isolation gate electrodes 18. Accordingly, each active region 4 is formed in a rectangular pattern, as shown in FIG. 1. Moreover, each bit line 16 is formed to overlap with the trench isolation region 2 and the conductor 16 is formed to connect the corresponding source drain 8 to the bit line 16 at the side surface thereof. Accordingly, the storage capacitor is formed over the bit line 16 to enlarge the area of the storage electrode 11. The large storage capacitance is thereby obtained.

The memory cell array as described above is produced by the following steps shown in FIGS. 5 to 15. It is noted that FIGS. 5–7 and 11–13 each represents the cross sectional view corresponding to the line B–B' of FIG. 1, FIGS. 8–9 each representing the cross sectional view corresponding to the line A–A' of FIG. 1, and FIGS. 14 and 15 each represents the cross sectional view corresponding to the line C–C' of FIG. 1.

Figure 5:
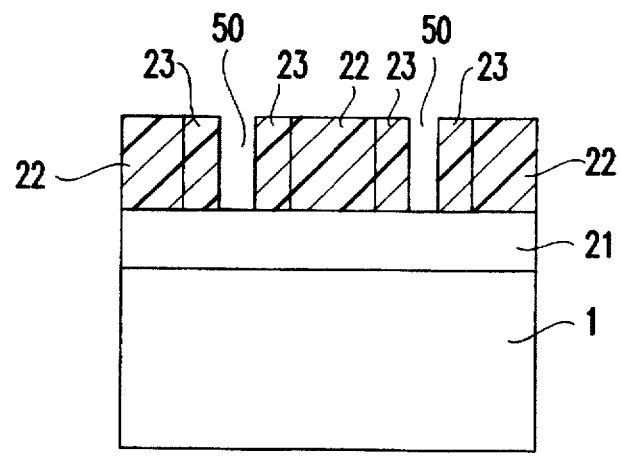
FIGS. 5 through 15 are cross sectional views illustrative of respective steps of a method for producing the device shown in FIGS. 1–4.
Figure 6:
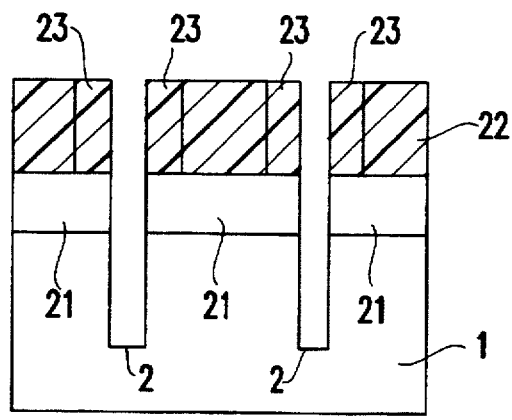
Figure 7:
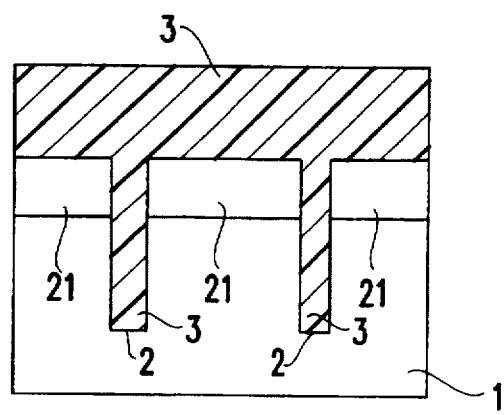
Figure 8:
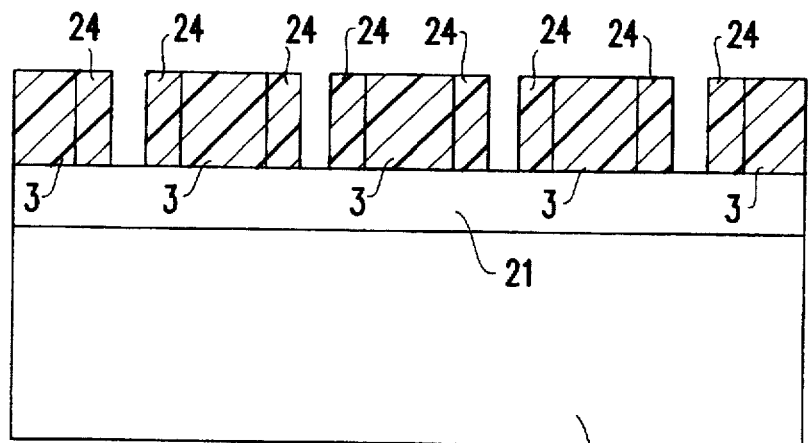
Figure 9:
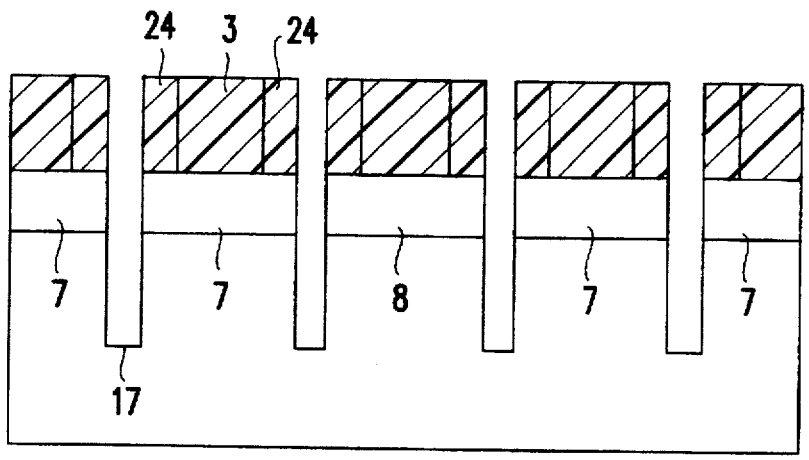
Figure 10:
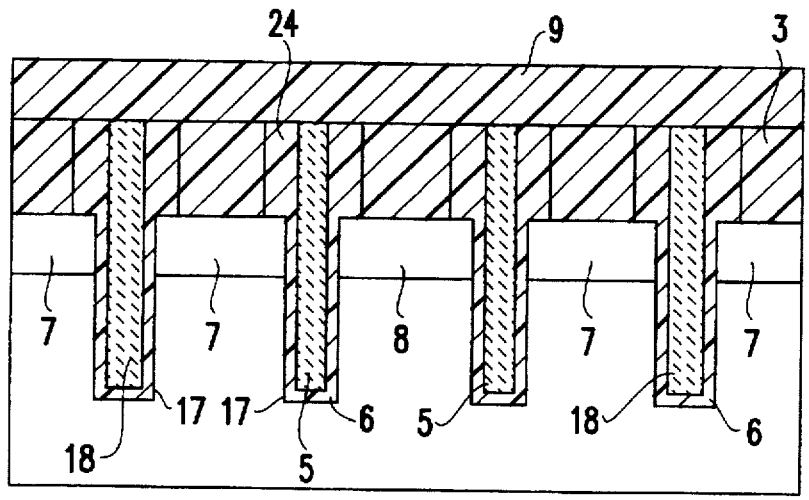
Figure 11:
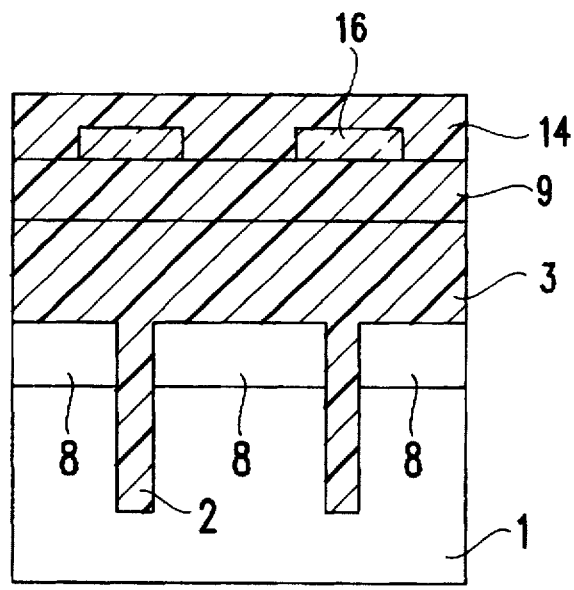
Figure 12:
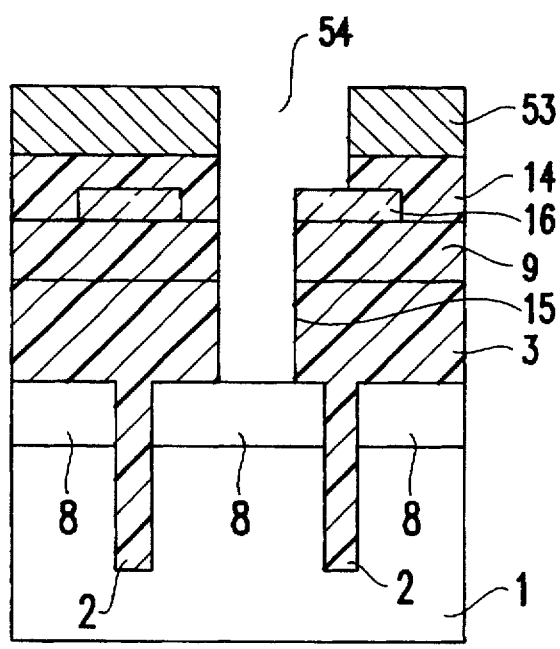
Figure 13:
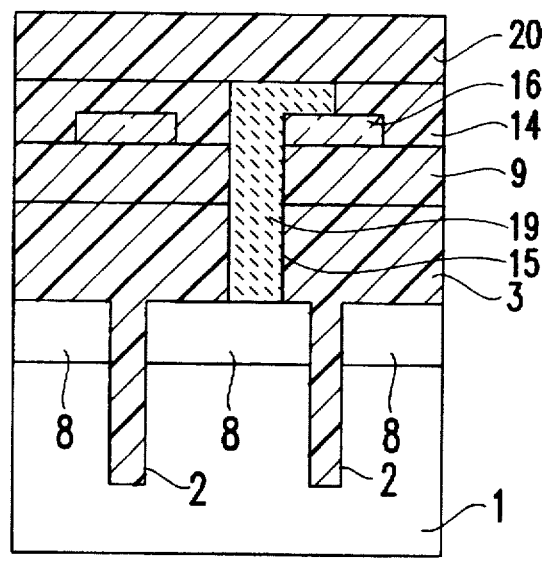
Figure 14:
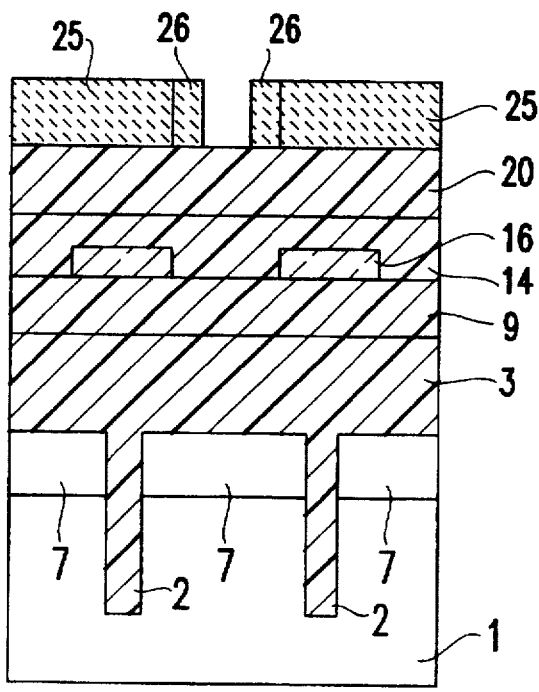
Figure 15:
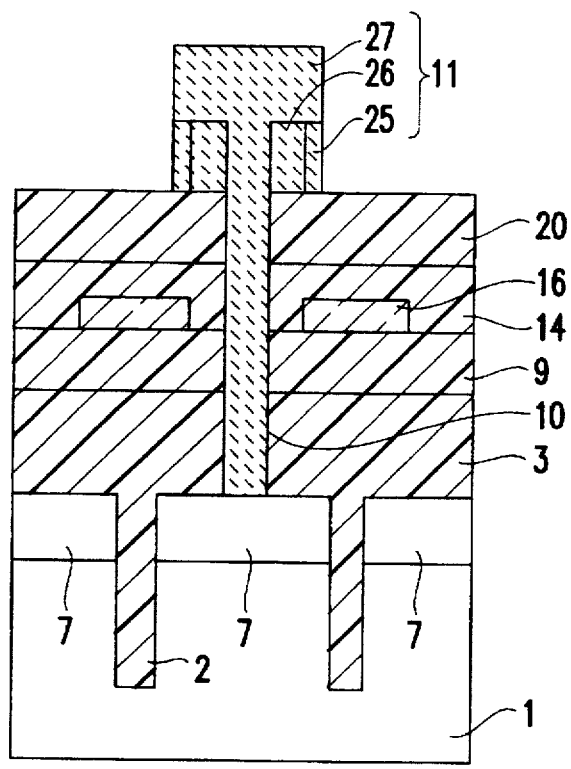
Figure 16:
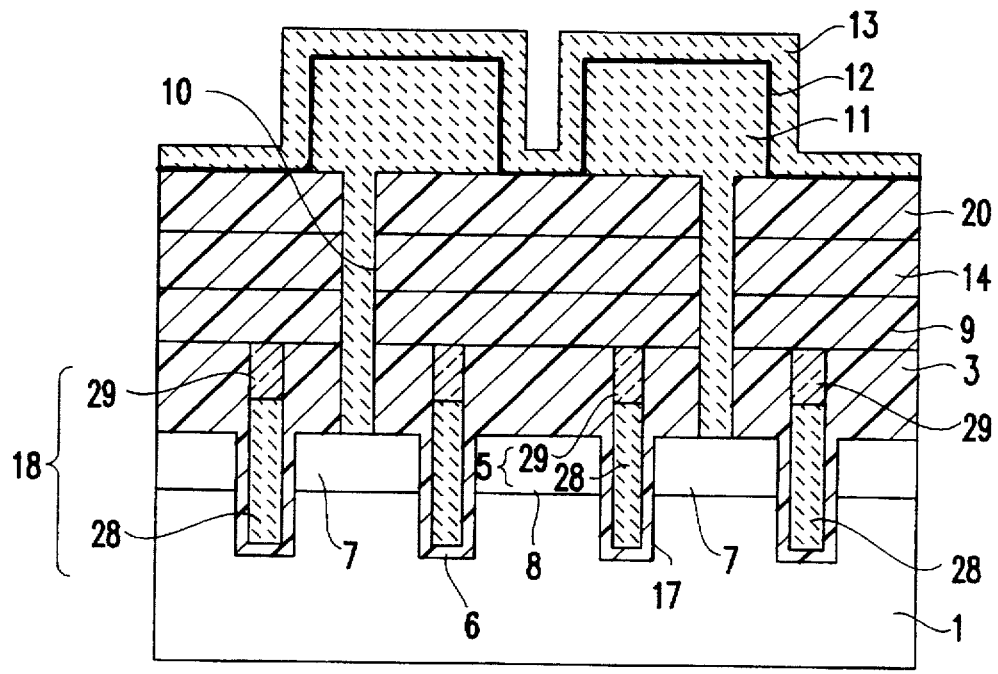
FIG. 16 is a cross sectional view illustrative of a second embodiment of the present invention.
Figure 17:
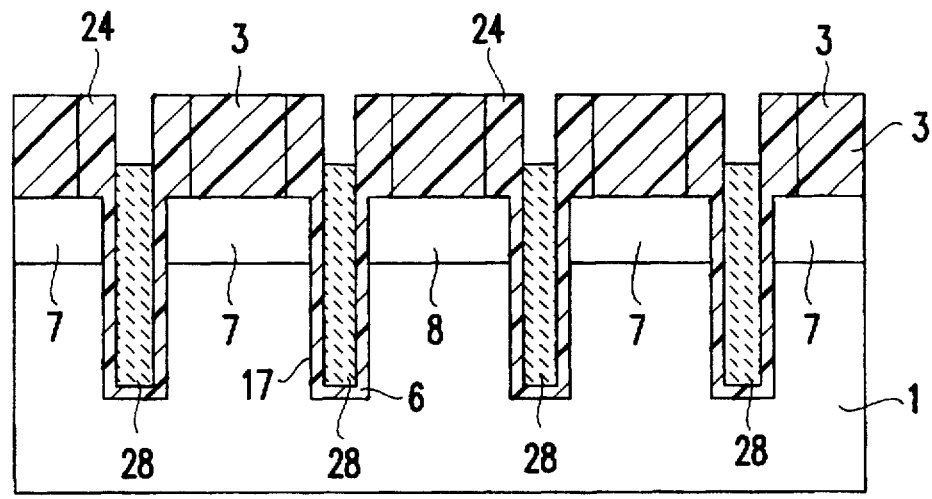
FIGS. 17 and 18 cross sectional views illustrative of respective steps of a method for producing the device shown in FIG. 16.
Figure 18:
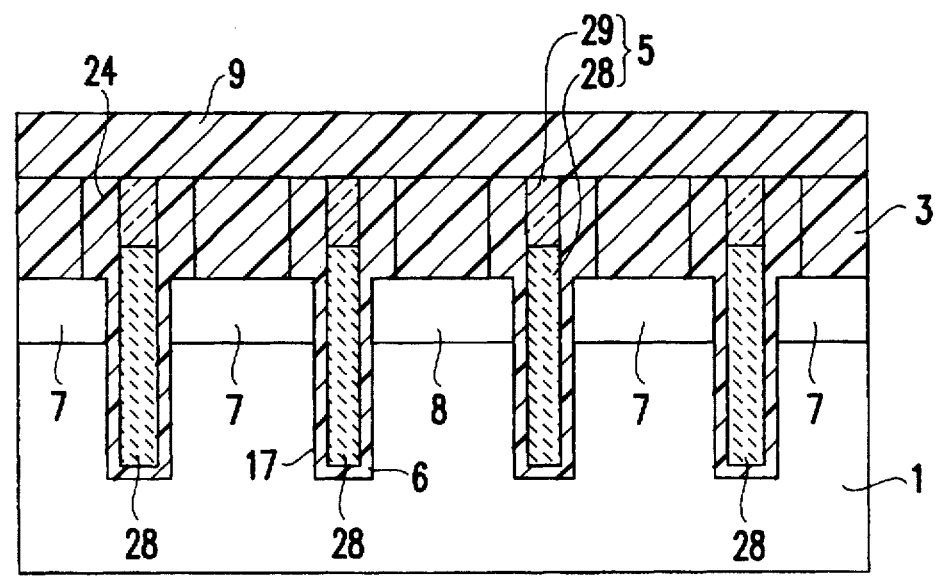
Figure 19:
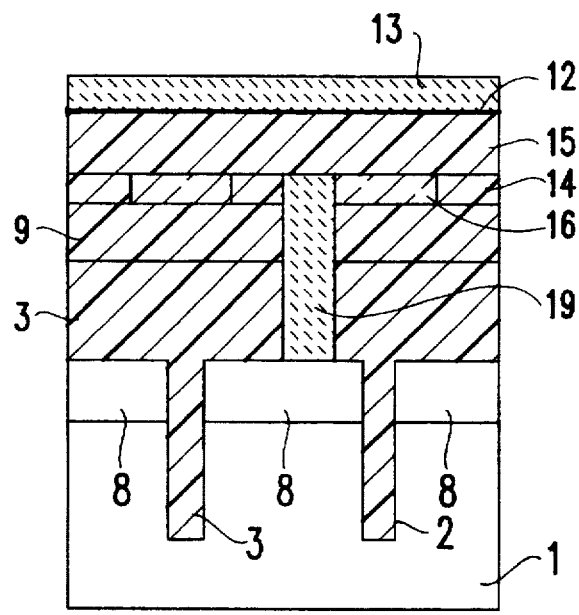
FIG. 19 is a cross sectional view illustrative of a third embodiment of the present invention.
Figure 20:
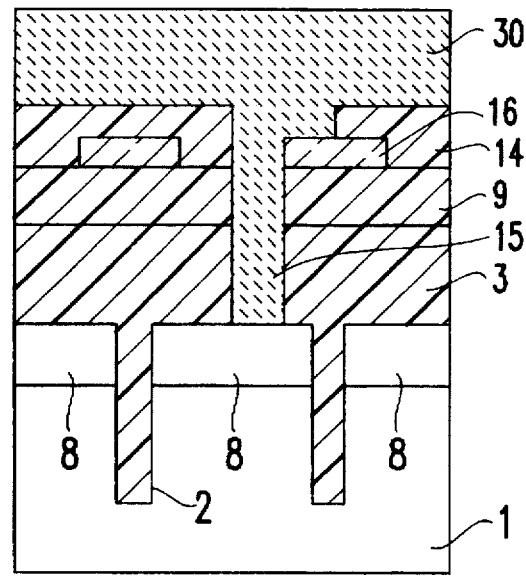
FIGS. 20 and 21 are cross sectional views illustrative of respective steps of a method for producing the device shown in FIG. 19.
Figure 21:
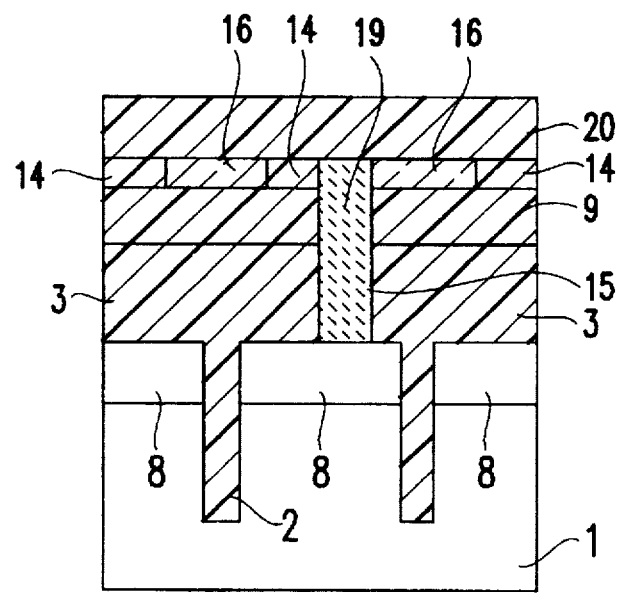
Figure 22:
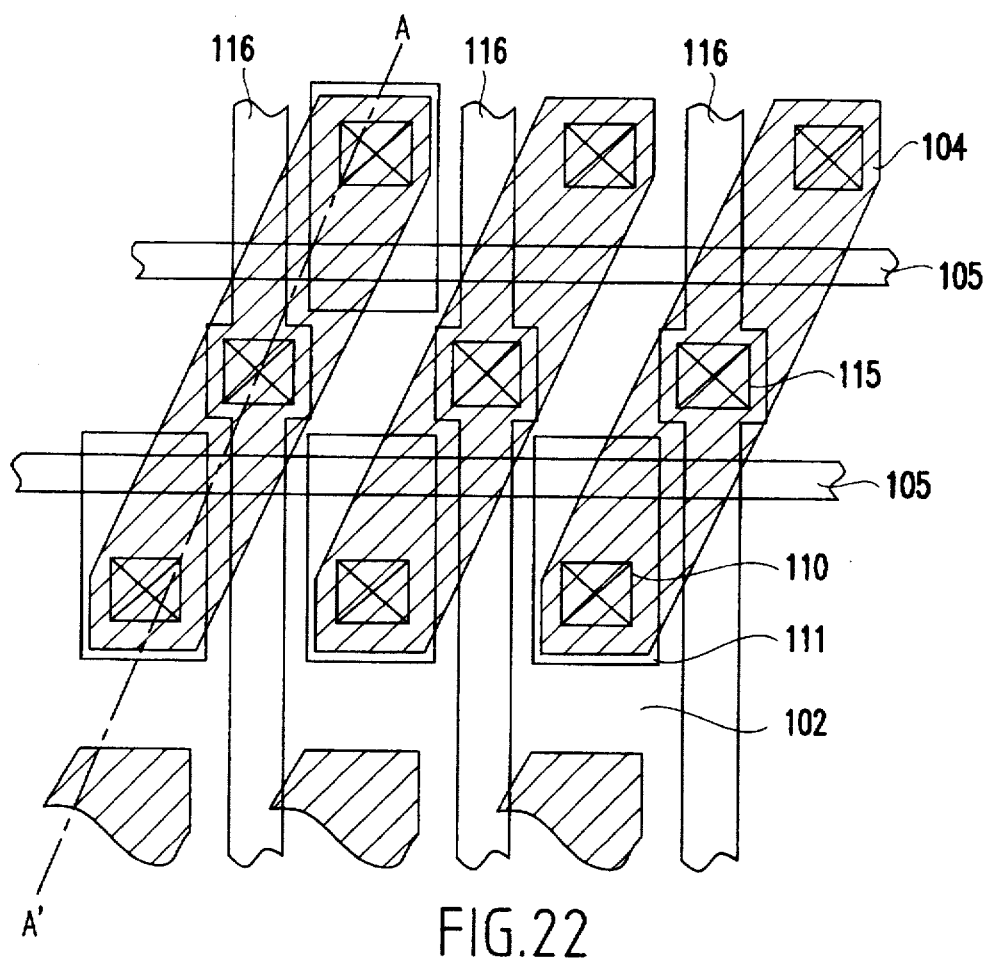
FIG. 22 is a plan view illustrative of a prior art device.
Figure 23:
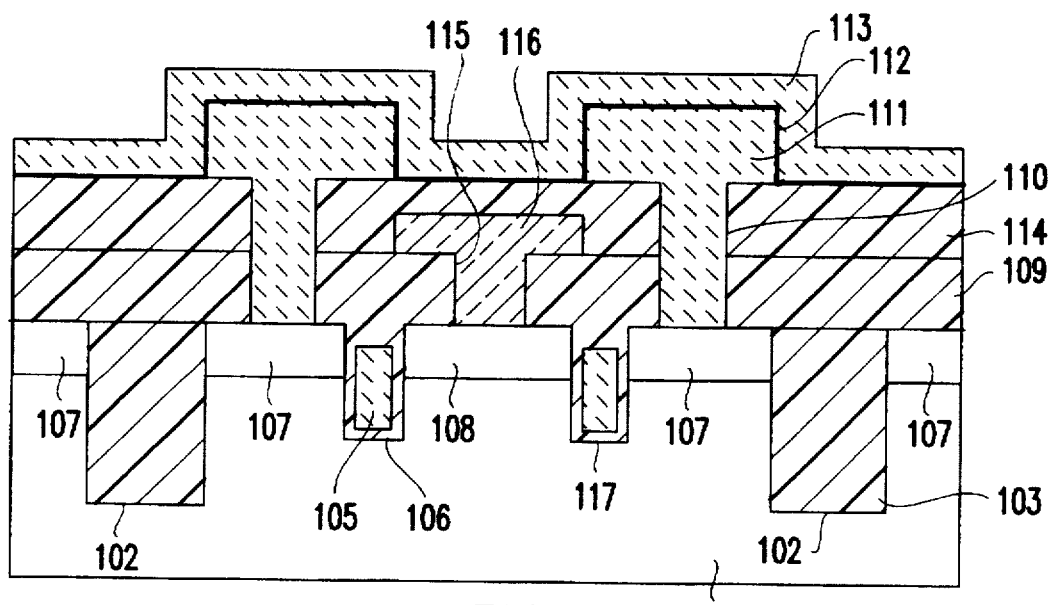
FIG. 23 is a cross sectional view along a line A–A' shown in FIG. 22.
Figure 24:
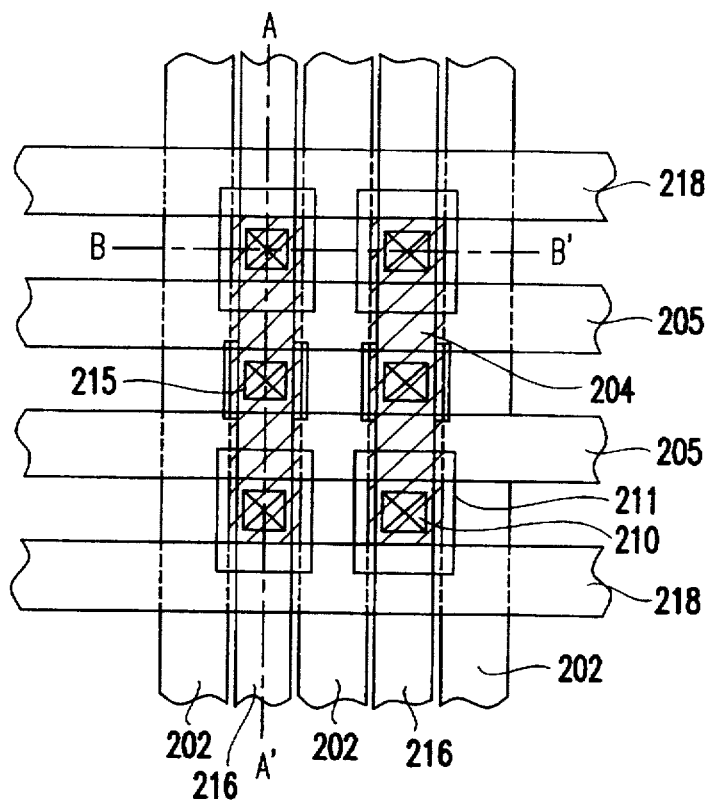
FIG. 24 is a plan view illustrative of another prior art device.
Figure 25:
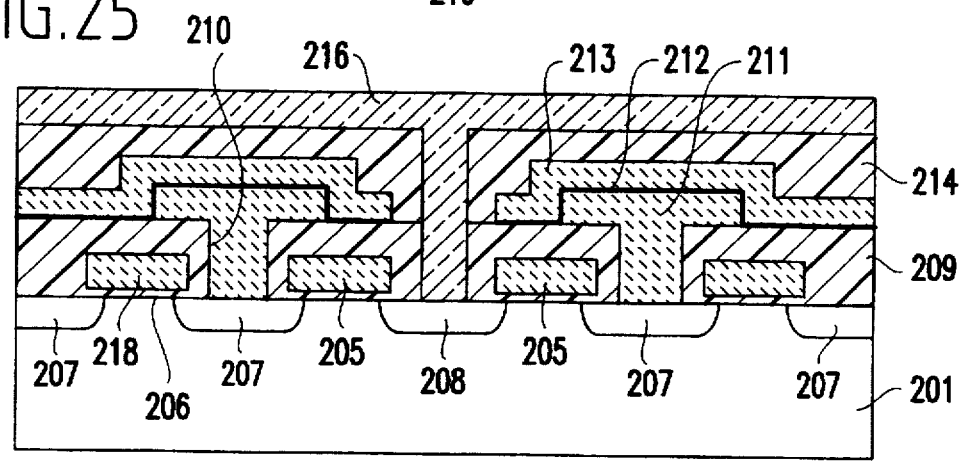
FIG. 25 is a cross sectional view along a line A–A' shown in FIG. 24.
Figure 26:
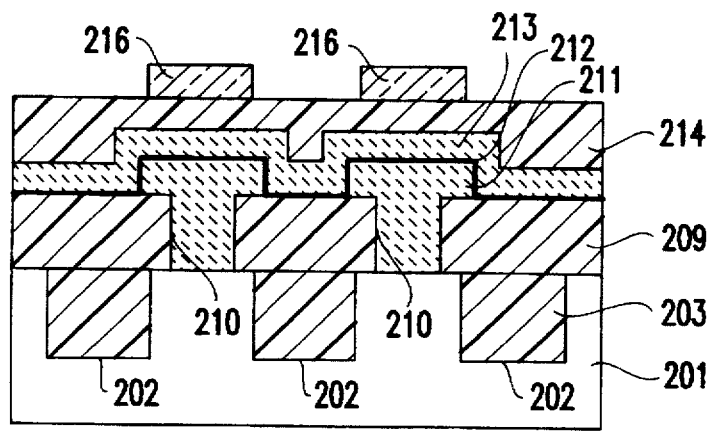
FIG. 26 is a cross sectional view along a line B–B' shown in FIG. 24.

As shown in FIG. 5, an N-type impurity such as arsenic is ion-implanted into a cell array formation portion of the P-type silicon substrate 1 to form an N-type layer 21, followed by forming a silicon oxide film 22 in 0.3 μm thick. The oxide film 22 is then selectively removed to form a plurality of slits in parallel to each other in 0.3 μm depth and 0.6 μm pitch. A silicon oxide film is thereafter deposited over the entire surface in 0.1 μm thick and then subjected to the so-called etching-back process. A plurality of spacers 23 made of silicon oxide is thereby formed at the respective side surfaces of the silicon oxide film 22 defining the slits. As a result, a plurality of slits 50 are formed in 0.1 μm width and 0.6 μm pitch.Next, as shown in FIG. 6, the substrate 1 is selectively removed by using the oxide films 22 and 23 as a mask. Consequently, the trenches 2 are formed in the substrate 1 in 0.1 μm width, 0.6 μm depth and 0.6 μm pitch.The silicon oxide films 22 and 23 are then removed, and a silicon oxide film 23 is deposited over the entire surface in 0.3 μm thick by the well-known chemical vapor deposition (CVD) method, as shown in FIG. 7. The oxide film 3 fills up each trenches 2 and the surface of the film 3 is made even.As shown in FIG. 8, a plurality of slits are formed in the silicon oxide film 3 in parallel to one another in 0.3 μm width and 0.6 μm pitch. A silicon oxide film is then deposited over the entire surface by the CVD method, followed by performing the etching-back process. Spacers 24 made of silicon oxide are thereby formed on the respective side wall surface of the oxide film 3 defining the slits. As a result, a plurality of slits 51 are formed in 0.1 μm width and 0.6 μm pitch.The silicon substrate 1 and the oxide film 3 filling each trench 2 are then selectively removed by using the films 3 and 24 as a mask. The trenches 17 are thus formed in 0.4 μm depth, as shown in FIG. 9. The layer 21 is also divided into the source and drain regions 7 and 8 by the trenches 2 and 17.As shown in FIG. 10, by the thermal oxidization, the gate insulating films 6 are formed on the surfaces of the trenches 17. A polysilicon layer doped with N-type impurities is thereafter deposited over the entire surface while filling each trench 17 by the CVD method and then subjected to the etching-back process. The word lines 5 and the isolation gate conductor lines 18 each made of polysilicon are thereby formed. The silicon oxide film 9 is then deposited over the entire surface by the CVD method.As shown in FIG. 11, the bit lines 16 are formed on the oxide film 9. As mentioned before, each of the bit lines 16 are formed to overlap and conceal in plan view the corresponding trench isolation region 2. The silicon oxide film 14 is thereafter formed to cover the bit lines 16 and the oxide film 9.As shown in FIG. 12, a photoresist film 53 is coated on the oxide film 14 and then selectively removed to form a contact hole pattern having a plurality of contact holes 54 therein. Each of the contact holes 54 is formed in 0.3 μm size to have one portion thereof located over the corresponding bit line 16 and the remaining portion located over the corresponding drain region 8 as shown. By using the contact hole pattern as a mask, the oxide films 14, 9 and 3 are selectively removed to form the bit line contact hole 15. The bit line contact hole 15 thereby exposes the respective parts of the top and sidewall surfaces of the bit line 16 and further a part of the drain region 8.The photoresist film 53 is then removed. Thereafter, as shown in FIG. 13, a polysilicon layer doped with the N-type impurities are deposited by the CVD method to fill the bit line contact hole 15 and then subjected to the dry-etching process. The conductor 19 is thereby formed to connect the drain region 8 to the corresponding bit line 16 through the bit line contact hole 15. The silicon oxide film 20 is thereafter deposited to cover the oxide film 14 and conductor 19.As shown in FIG. 14, a polysilicon layer 25 are deposited on the oxide film 20 in 0.2 μm thick, and a contact hole pattern having a plurality of holes is formed in the layer 25. Each of the hole is in 0.3 μm size. Another polysilicon film is deposited over the entire surface in 0.1 μm thick, followed by carrying out the etching-back process. The polysilicon side spacers 26 are thus formed on the respective side surfaces of the layer 25 defining the holes. Thus, a new contact hole pattern is formed by the polysilicon layers 25 and 26. Each of holes in this pattern is formed in 0.1 μm size. As shown in FIG. 15, the oxide films 20, 14, 9 and 3 are selectively removed by using the contact hole pattern as a mask. The capacitor contact hole 10 is thus formed to expose a part of the source region 7. A polysilicon layer doped with N-type impurities are deposited to fill the capacitor contact hole 10 and then selective removed together with the layer 25. Thus, the storage electrode 11 made of polysilicon is formed.Turning back to FIG. 2, the dielectric film 12 and the cell plate electrode 13 are thereafter formed. Thus, the memory cell shown in FIGS. 1–4 is derived.Referring to FIG. 16, there is shown a second embodiment of the present invention in which the same constituents as those shown in FIGS. 1–4 are denoted by the same reference numerals to omit the further description thereof. In this memory cell, each of the word lines 5 and isolation gate conductor lines 18 is composed of a polysilicon conductor 28 and a tungsten silicide conductor 29. The polysilicon conductor 28 serves directly as the gate electrode of the cell transistor, and the silicide conductor 29 is formed apart form the gate insulating film 6. Accordingly, the resistance of each word line 5 is reduced without lowering the withstand voltage of the gate insulating film 6.This word line structure is formed by the steps shown in FIGS. 17 and 18. Specifically, as shown in FIG. 17, after forming the gate oxide film 6, a polysilicon layer doped with N-type impurities is deposited to fill the trenches 17. the polysilicon thus deposited is then subjected to the etching-back process and further to the over-etching process. The polysilicon conductor 28 is thus formed with a recess over the conductor 28.As shown in FIG. 18, a tungsten silicide layer is thereafter deposited over the entire surface while filling the recess, followed by carrying out the etching-back process. The tungsten conductor 29 is thereby formed. The silicon oxide film 9 is then deposited over the entire surface. If desired, other material such as titanium silicide, copper, gold and the like may be employed as the conductor 29.Referring to FIG. 19, there is shown a third embodiment of the present invention, in which the same constituents as those shown in FIGS. 1–4 are denoted by the same reference numerals to omit the further description thereof. In this embodiment, the polysilicon conductor 19 is in contact only with the sidewall surface of the bit line 16 to connect the drain region 8 to the bit line 16. Moreover, the bit line 16 is not covered with the silicon oxide film 14. Accordingly, the height of the interlayer insulating film composed of the oxide films 9, 14 and 20 is reduced to make it easy that the capacitor contact hole 20 is formed to penetrate the oxide films 20, 14, 9 and 3.This device is formed as follows: Specifically, as shown in FIG. 20, after forming the bit line contact hole 15, a polysilicon layer 30 doped with N-type impurities are deposited over the entire surface with filling the hole 15. Thereafter, the polysilicon layer 30 and the oxide film 14 are polished until the surfaces of the bit lines 16 are exposed, as shown in FIG. 21. The silicon oxide film 20 is then deposited. As described above, the memory cell according to the present invention is formed in a fine pattern with an enlarged storage capacitance.It is apparent that the present invention is not limited to the above embodiments, but may be modified and changed without departing from the scope and spirit of the invention. For example, the respective conductivity types are changed to other types, and the other suitable impurities can be employed to form the source and drain regions. Moreover, the material for the respective insulating films or layers may be replaced with other suitable ones such as a silicon nitride film or a silicon oxide film including a phosphorus and/or boron.

What is claimed is: 1. A semiconductor memory device having a plurality of memory cells each including a cell transistor and a storage capacitor, each of said memory cells comprising:

an active region defined in a first direction by a pair of trench isolation regions formed in a semiconductor substrate in parallel to each other and in a second direction perpendicular to said first direction by a pair of isolation gate conductor lines formed on a first insulating film covering said semiconductor substrate in parallel to each other;

first and second regions selectively formed in said active region apart from each other to define a channel region of said cell transistor therebetween;

a gate insulating film formed on said channel region, said first insulating film having the same thickness as said gate insulating film;

a word line formed on said gate insulating film;

a second insulating film formed to cover said active region and said word line;

a bit line formed on said second insulating film to overlap with one of said trench isolation regions;

a third insulating film covering said bit line and said second insulating film;

a connection conductor buried in said second and third insulating films and having a first end portion formed in contact with a part of said first region and a second end portion formed in contact with at least a sidewall surface of said bit line;

a capacitor contact hole selectively formed in said second and third insulating films to expose a part of said second region; and a capacitor electrode for said storage capacitor formed in contact with said part of said second region through said capacitor contact hole.

2. A semiconductor memory device having a plurality of memory cells each including a cell transistor and a storage capacitor, each of said memory cells comprising an active region defined in a first direction by a pair of trench isolation regions formed in a semiconductor substrate in parallel to each other and in a second direction perpendicular to said first direction by a pair of isolation gate conductor lines formed on a first insulating film covering said semiconductor substrate in parallel to each other, first and second regions selectively formed in said active region apart from each other to define a channel region of said cell transistor therebetween, a gate insulating film formed on said channel region, said first insulating film having the same thickness as said gate insulating film, a word line formed on said gate insulating film, a second insulating film formed to cover said active region and said word line, a bit line formed on said second insulating film to overlap with one of said trench isolation regions, a third insulating film covering said bit line and said second insulating film, a connection conductor buried in said second and third insulating films and having a first end portion formed in contact with a part of said first region and a second end portion formed in contact with at least a sidewall surface of said bit line, a capacitor contact hole selectively formed in said second and third insulating films to expose a part of said second region, and a capacitor electrode for said storage capacitor formed in contact with said part of said second region through said capacitor contact hole, wherein each of said trench isolation regions comprises a first trench formed in said semiconductor substrate and a fourth insulating film filling said first trench and each of said isolation gate conductor lines is buried in a second trench formed in said semiconductor substrate and isolated therefrom by said first insulating film, each of said active regions further comprising a third trench formed in said semiconductor substrate, said word line being buried in said third trench with an intervention of said gate insulating film.

3. The device as claimed in claim 2, wherein said first trench has a first depth and each of said second and third trenches has a second depth that is shallower than said first depth.

4. The device as claimed in claim 2, wherein said word line comprises a first conductor having a first resistance and a second conductor formed on said first conductor and having a second resistance lower than said first resistance.

5. The device as claimed in claim 4, wherein said first conductor is made of polysilicon and said second conductor is made of one of metal and silicide.

6. The device as claimed in claim 1, wherein each of said isolation gate conductor lines is supplied with a bias voltage.

7. A semiconductor memory device comprising a semiconductor substrate, a plurality of first trenches selectively formed in said semiconductor substrate in a column direction in parallel to one another, a first insulating film filling each of said first trenches, a plurality of second trenches selectively formed in said semiconductor substrate and said first insulating film in a row direction in parallel to one another, a plurality of conductor lines each buried in an associated one of said second trenches with an intervention of a first gate insulating film, said semiconductor substrate thereby having a surface portion thereof partitioned into a plurality of active regions arranged in a matrix form of rows and columns, a plurality of third trenches selectively formed in said semiconductor substrate and said first insulating film in said row direction in parallel to one another, each of said third trenches crossing associated ones of said active regions which are arranged in the same row, a plurality of word lines each buried in an associated one of said third trenches with an intervention of a second gate insulating film, a plurality of pairs of source and drain regions each pair formed in an associated one of said active regions, a second insulating film covering said first insulating film, said conductor lines, said active regions and said word lines, a plurality of bit lines each formed on said second insulating film in said column direction to overlap with an associated one of said conductor lines, a plurality of bit line connection conductors each formed in said second insulating film to connect a corresponding one of said drain regions to a corresponding one of said bit lines with being in contact with at least a sidewall surface of the corresponding one of said bit lines, a third insulating film formed to cover said bit lines and said second insulating film, and a plurality of capacitors each having a capacitor electrode connected to an associated one of said source regions.

8. The device as claimed in claim 7, each of said conductor lines is supplied with a bias voltage to prevent a channel region from being formed along each of the second trenches.

* * * * *